United States Patent [19]

Scheibner

[11] Patent Number: 5,021,000
[45] Date of Patent: Jun. 4, 1991

[54] ZERO INSERTION FORCE SOCKET WITH LOW INDUCTANCE AND CAPACITANCE

[75] Inventor: Harry J. Scheibner, San Jose, Calif.

[73] Assignee: National Semiconductor Corporation, Santa Clara, Calif.

[21] Appl. No.: 439,900

[22] Filed: Nov. 20, 1989

[51] Int. Cl.⁵ .................................................. H01R 4/50
[52] U.S. Cl. ........................................ 439/342; 439/259
[58] Field of Search ............... 439/65, 70, 75, 259, 439/260, 262, 263, 264, 266, 268, 270, 342, 525, 632

[56] References Cited

U.S. PATENT DOCUMENTS

| | | | |
|---|---|---|---|
| 4,478,472 | 10/1984 | Baar | 439/59 X |
| 4,538,870 | 9/1985 | Thewlis | 439/329 |
| 4,887,974 | 12/1989 | Ichimura et al. | 439/259 |

FOREIGN PATENT DOCUMENTS 2083298  3/1982  United Kingdom ................ 439/259

OTHER PUBLICATIONS

IBM Technical Disclosure Bulletin, vol. 17, No. 2, 7-1974, High-Density Double-Contact Zero Insertion Force Connector, Anzalone et al.
Textool Zip dip II Socket, Spec. Sheet.
TTM CCLM Spec. Sheet.
3M, ZIP DIP II Socket (High Temperature 300° C.), Spec. Sheet.
Augat, Inc., Actuated LIF Socket, Spec. Sheet.
AMP, ZIP-Lock Connector, Spec. Sheet.
Welcon Series 630 PRO-ZIF, Spec. Sheet.
Welcon Series 504 ZIF-DIP, Spec. Sheet.
Sym-Tek Systems, Inc., Spec. Sheet.
Unnamed, Single and dual Beam, Four Leaf and Cage Spec. Sheet.
Betaflex, High Performance Interconnection Spec. Sheet.
Euler Column Spec. Sheet.
Tecknit, Low Resistance Connectors Spec. Sheet.

Primary Examiner—Paula A. Bradley
Assistant Examiner—Khiem Nguyen
Attorney, Agent, or Firm—Townsend and Townsend

[57] ABSTRACT

A supporting plate holds a test device and is moved so that the pins of the device are electrically connected to a plurality of contact springs further connected to selected signal sources mounted on input and output boards. This approach avoids both using contact plates and an unduly long contact path between the test device and board, thereby minimizing parasitic inductance and capacitance. This provides improved test results for the devices tested and increased accuracy over well known types of sockets. The test socket design allows easy repair, maintenance and use which greatly increases test productivity and reliability.

21 Claims, 2 Drawing Sheets

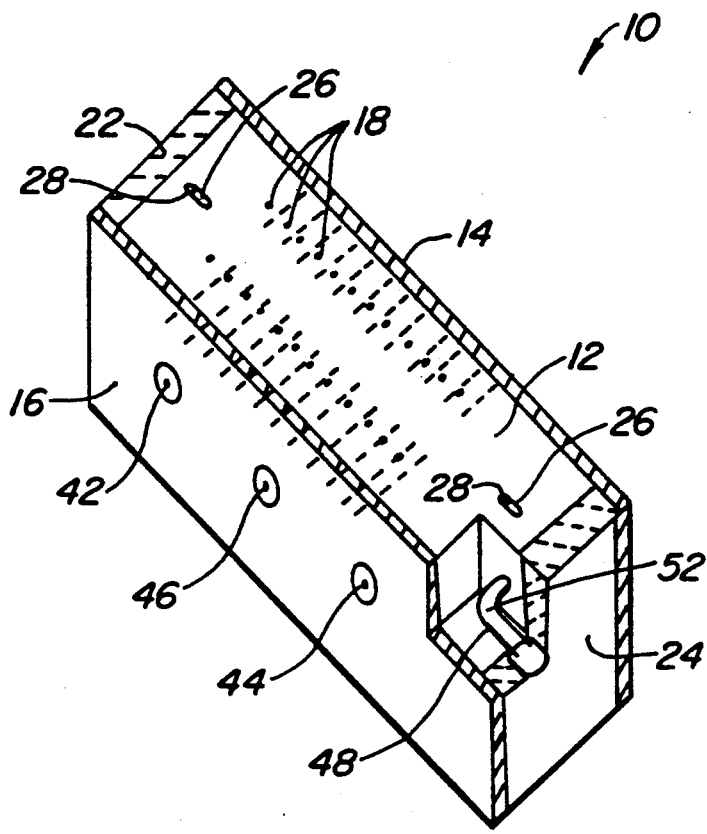
FIG._1.
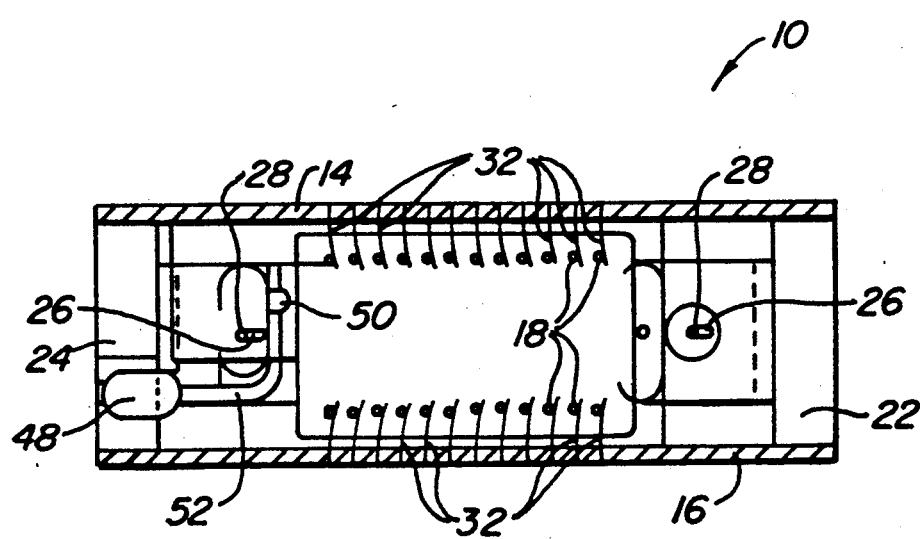
FIG._2.

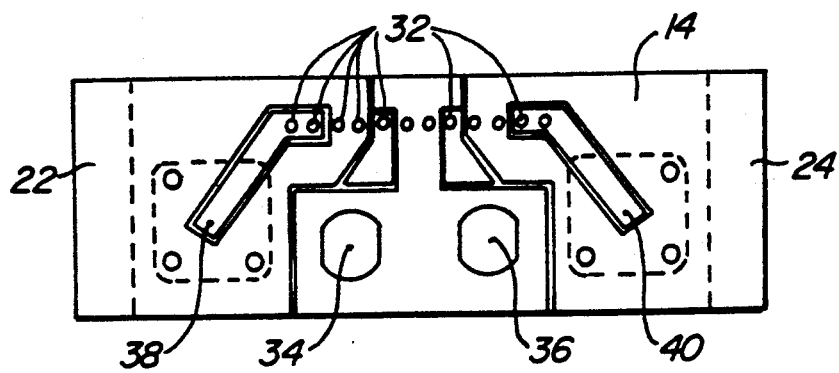
FIG._3.
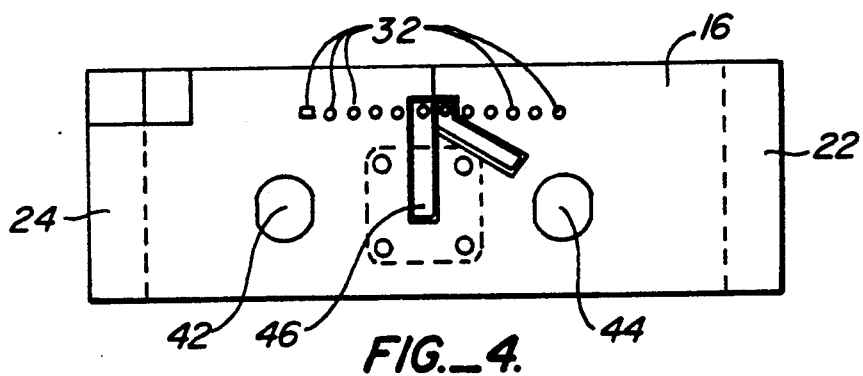
FIG._4.
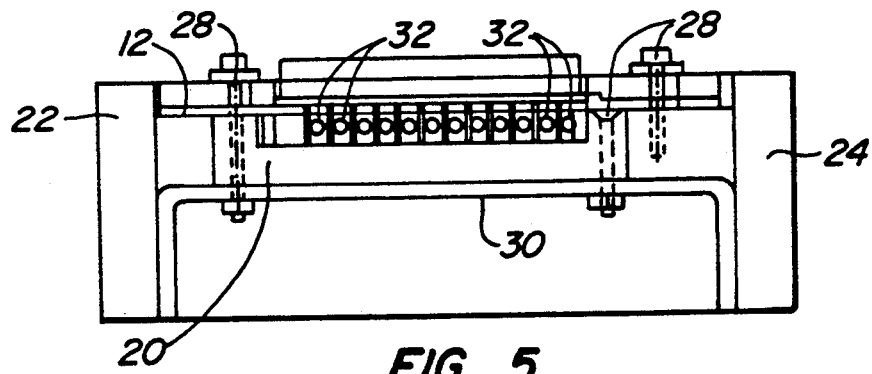
FIG._5.
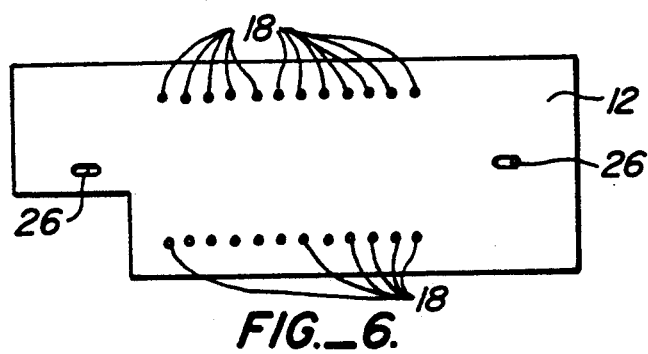
FIG._6.

ZERO INSERTION FORCE SOCKET WITH LOW INDUCTANCE AND CAPACITANCE

BACKGROUND OF THE INVENTION

The present invention relates generally to integrated circuit test sockets and in particular to zero insertion force sockets with low parasitic inductance and capacitance.

Test sockets for integrated circuit devices have long been designed to allow easy and rapid replacement for mass testing and observation. The prior art sockets all share a similar approach of using parallel contact plates to clamp on the test device pins and hold it in place. These contact plates are further connected to the mounting pins that extend below to the testing board.

One example of a commercially available socket is sold by 3M under the tradename ZIP DIP II Socket. The 3M socket uses the parallel opposing plates to electrically connect and hold the test device and has extending contacts for mounting on a board. A similar socket is manufactured by Textool Products, Inc., and also clamps the contact plates on the device lead pins. Yet another socket that clamps the device leads is the Actuated Life Socket 900 Series marketed by AUGAT.

The use of opposing contact plates to hold the device pins and of leads connected to the contact plates extending to the testing board create two inherent critical problems that affect the reliability and accuracy of the device test results. First, the two opposing contact plates generate parasitic capacitance that interferes with the testing process. Second, the extended leads lengthen the contact path between the device pins and the test socket thereby creating parasitic inductance, also affecting the test results.

Though parasitic capacitance and inductance might be eliminated by finding an alternative contact system, none have yet been shown that avoid using opposing contact plates for holding the device or reduce the contact lead path between the test device and testing board. Though existing sockets can hold a test device in place securely during testing with easy removal and rapid replacement of the device, no socket has been able to minimize either parasitic capacitance or inductance, or both.

Another problem with the available prior art devices is their complicated method of holding the test device. Contact plates can lose their spring and can lead to weak electrical contact, while extended leads can break requiring replacement.

SUMMARY OF THE INVENTION

This invention provides a test socket that greatly minimizes parasitic inductance, significantly reduces parasitic capacitance, and provides a test socket that allows replacement of parts so that it is easy to repair.

According to the invention, a push plate holds a test device and is moved so that the pins of the device are electrically connected to selected voltage and signal sources. This approach avoids using contact plates and an unduly long contact path between the test device and test connections, thereby reducing the parasitic inductance and capacitance. This provides improved test results for the devices tested and increases accuracy over well known types of sockets. Moreover, the test socket design of the present invention allows for ease of repair, maintenance and use, which greatly increases test productivity and reliability.

Furthermore, the socket in the present invention offers input and output sources allowing direct measuring by testing apparatus without being placed directly on a computer board as required by some prior art sockets. This freedom allows rapid replacement of a variety of test sockets with an appropriate one.

An important advantage of the present invention is that parasitic capacitance is greatly reduced by eliminating contact plates as a means for holding the test device. Another advantage of the present invention is that it offers decreased parasitic inductance by reducing the contact path between the test device and board. Still another advantage of the present invention is the ease of repair of the test socket when a contact part should break or bend.

These and other advantages of the present invention will become apparent to those of ordinary skill in the art in view of the following detailed description and drawings.

BRIEF DESCRIPTION OF DRAWING

FIG. 1 is a perspective view of a zero insertion force socket;

FIG. 2 is an interior bottom plan view of a zero insertion force socket showing a test device engaged with the contact springs;

FIG. 3 is a side view of the zero insertion force socket showing the input panel;

FIG. 4 is a side view of the zero insertion force socket showing the output panel;

FIG. 5 is a cutaway side view of the zero insertion force socket showing a device inserted thereon; and FIG. 6 is a top plan view of a supporting plate.

DETAILED DESCRIPTION OF THE PREFERRED EMBODIMENT

FIG. 1 is a perspective drawing of a zero insertion force socket 10 according to the present invention. Socket 10 includes a supporting plate 12, an input board 14, and an output board 16. An integrated circuit device is held in socket 10 while receiving power and signal inputs through input board 14 and providing signal and control outputs through output board 16.

Supporting plate 12 (also shown in FIG. 6) is a generally rectangular shaped platform having a plurality of insertion openings 18 sized and aligned according to the dual-in-parallel (DIP) standard, for receiving and holding the pins of an integrated circuit (IC) device for testing. As illustrated in FIG. 5, showing a side interior cutaway view, supporting plate 12 is mounted on a support base 20 with a first support end 22 fastened at one end of socket 10 and a second support end 24 fastened at the opposite end of socket 10. The base 20 provides support and rigidity to the overall structure.

Two elongated oval holding openings 26 extend through supporting plate 12 and receive fastening members 28 for securing supporting plate 12 to mounting member 30. The oval openings allow supporting plate 12 to slide a controlled distance depending on the size of the openings 26. Fastening members 28 secure mounting member 30 to support base 20. The fastening members 28 also hold supporting plate 12 to mounting member 30 and allow supporting plate 12 to move.

Input board 14, as illustrated in side view in FIG. 3, is rectangular shaped and includes a plurality of contact springs 32 generally corresponding to the number of insertion openings 18 in supporting plate 12. Furthermore, each contact spring 32 is connected either to a first voltage input 34, a second voltage input 36, a first signal input 38 or a second signal input 40 as required for the specific IC device to be tested. Each of these connector inputs provides either power or signal input to the device through contact springs 32. Each connector input can be a coaxial receptor, or other well known input connector.

FIG. 4 is a side view of the socket 10, opposite that of FIG. 3, showing output board 16. Output board 16 is similar to input board 14 in shape, except where input board 14 supplies power and signals to the device held in socket 10, output board 16 provides a ground 46, at least one control 44 and at least one signal output 42 to enable an external circuit to measure and observe the performance of the IC device being tested. The output connectors used can be any well known electrical connector such as a coaxial receptor, but is not limited thereto.

In addition, specific IC devices require specific attachment of the leads to the appropriate input and output connectors. Therefore, each specific IC device requires a specific test socket having the appropriate connector/contact-spring arrangement connecting the leads of the IC device. Since the electrical connectors allow easy detachment from the testing apparatus, one type of test socket can be replaced with another type socket when testing of a different type of IC device is desired.

FIG. 2 is an interior bottom plan view and illustrates how input board 14 is mounted on one side of socket 10 perpendicular to supporting plate 12. One end of input board 14 is attached to first support end 22 and the other end is attached to second support end 24 by fastening means such as by screw or simple adhesive. With input board 14 perpendicular to supporting plate 12, contact springs 32 align generally with insertion openings 18 so that the pins of the test device will electrically connect with contact springs 32 when supporting plate 12 is moved by a cam actuator 48 described further below. The resilient contact springs 32 act on the device lead pins to hold the device securely in place. This allows first voltage input 34, second voltage input 36, at least one first signal input 38 and at least one second signal input 40 to electrically connect with the test device.

FIG. 2 also illustrates how output board 16 is mounted to socket 10 in the same manner as the input board 14. Output board 16 attaches one end to first support end 22 and the other end to second support end 24 by simple fastening means, such as screw or simple adhesive. Output board 16 is perpendicular to supporting plate 12 and parallel to input board 14. Output board 16 provides the output signals from the test device. Contact springs 32 are also aligned with insertion openings 18 to allow electrical contact with ground 46, control 44, and signal output 42.

This arrangement of contact springs 32 connecting to the device pins greatly minimizes parasitic inductance and capacitance since no parallel opposing plates are used, and the contact path between the device pins and test socket is decreased. Tests show the socket of the present invention to have a fourteen decibel improvement in isolation between input over test sockets in the prior art. (The isolation test of the present invention measured 81 dB, while a specific test socket considered an industry standard, the Textool ZIP DIP II, of at best only 67 dB.)

Cam actuator 48 operates to move supporting plate 12 for engaging or disengaging an IC device. Cam actuator 48 includes an oval bearing cam 50 and a control arm 52 (FIG. 2) that is limited in travel to approximately a quarter turn. As bearing cam 50 rotates a quarter turn the widest diameter of cam actuator 48 moves supporting plate 12 a controlled distance, thereby bringing the pins of the device in contact with contact springs 32.

Using cam actuator 48 to engage or disengage an IC device is merely one embodiment of the present invention. Other means to move the supporting plate 12 could include any one of the following well known methods: non-mechanical means such as guiding the supporting plate by hand with holding ridges formed on both supporting plate 12 and base 30; locking tab means including a tongue and groove holding portion that is released by simply depressing a tab; or lever means that moves in a controlled radius, having one end urging supporting plate 12 a controlled distance thus engaging the IC device leads with contact springs 32.

Supporting plate 12, input board 14 and output board 16 ideally are made of a material with excellent electrical insulating properties to shield the device tested from leakage. One such material is conventional fiberglass printed circuit board, but similar insulating materials will also function satisfactorily. Additionally, the contact springs 32 found on both input board 14 and output board 16 are preferably made of an alloy, which has good shape retention, high tensile strength, good conductivity, and good corrosion resistance. Typically, springs 32 are soldered in place to allow easy replacement should a contact spring 32 break or deform.

In operation, a test device is placed in socket 10 with its pins protruding through insertion openings 18 of supporting plate 12 and aligned with contact springs 32. Cam actuator 48 is engaged to move supporting plate 12 so that the device pins electrically connect with contact springs 32 and the spring tension of contact springs 32 hold the test device securely in place. Contact springs 32 provide electrical connection to the various input and output connectors on input board 14 and output board 16.

Since the socket in the present invention eliminates parallel plate holders and overly long contact paths as found in the prior art, both parasitic inductance and parasitic capacitance are substantially reduced. This yields an increased isolation between inputs of fourteen decibels (81dB) in the present invention over available prior art sockets (67dB). The reduced coupling of unwanted interference offers more accurate and consistent test results and higher product yields. In addition, the contact springs 32 are removable so that if one spring breaks or is otherwise damaged, it can easily be replaced without replacing the zero insertion force socket.

Although the present invention has been described in terms of specific embodiments, it is anticipated that alterations and modifications thereof will be apparent to those skilled in the art in view of this description. It is therefore not intended that the invention be limited, except as indicated by the following claims.

What is claimed:

1. A socket with low parasitic inductance and capacitance for holding a device having pins, said socket comprising:

a supporting plate including a plurality of insertion openings for receiving said device pins;

a first plurality of contact springs aligned with said insertion openings;

means for positioning said springs relative to said device pins so that said springs and said device pins are electrically coupled; and a plurality of selective electrical connectors positioned proximate said supporting plate and further connected to said contact springs.

2. The socket according to claim 1, wherein said positioning means includes:

means for securing said supporting plate for allowing said supporting plate to move a controlled distance; and means for moving said supporting plate a controlled distance after said device is inserted so that the pins from said device inserted in the insertion openings are electrically connected to said contact springs.

3. A socket as set forth in claim 1, further comprising a second plurality of contact springs aligned with said insertion openings and parallel to said first plurality of contact springs.

4. A socket as set forth in claim 2, wherein said moving means comprises a cam actuator for moving said supporting plate a controlled distance.

5. A socket as set forth in claim 2, wherein said moving means is a lever arm pivotally mounted adjacent said supporting plate for moving said supporting plate a controlled distance.

6. A socket as set forth in claim 2, wherein said moving means comprises a base for supporting said supporting plate wherein said base and said supporting plate include holding means for said supporting plate after said supporting plate has been moved a controlled distance.

7. A socket with low parasitic inductance and capacitance for holding a device having pins, said socket comprising:

a supporting plate including a plurality of insertion openings for receiving said device pins;

a first plurality of contact springs aligned with said insertion openings;

means for positioning said springs relative to said device pins so that said springs and said device pins are electrically coupled; and a first board positioned along a first edge of said supporting plate; and a second board positioned along a second edge of said supporting plate and parallel to said first board with said contact springs positioned on said boards.

8. A socket as set forth in claim 7 with said electrical connectors mounted on said boards.

9. A socket as set forth in claim 7, wherein said contact springs are attached to project from said boards below said insertion openings.

10. A socket as set forth in claim 9, wherein said contact springs extend at right angles to said boards.

11. A socket as set forth in claim 7, wherein said contact springs are demountably attached to one of said boards.

12. A socket with low parasitic inductance and capacitance for holding a device with pins having a first end attached to said device and second end extending therefrom, said socket comprises:

a supporting plate including a plurality of insertion openings for receiving said device pins;

a first plurality of contact springs aligned with said insertion openings;

means for positioning said springs close to said first end of said device pins so that said springs and said device pins are electrically coupled; and a plurality of selective electrical connectors positioned proximate said supporting plate and connected to said contact springs.

13. The socket according to claim 12 wherein said positioning means includes:

means for securing said supporting plate for allowing said supporting plate to move a controlled distance; and means for moving said supporting plate a controlled distance after said device is inserted so that the pins from said device inserted in the insertion openings are electrically connected to said contact springs.

14. A socket as set forth in claim 12, further comprising a second plurality of contact springs aligned with said insertion openings and parallel to said first plurality of contact springs.

15. A socket as set forth in claim 12, further comprising:

a first board positioned along a first edge of said supporting plate; and a second board positioned along a second edge of said supporting plate and parallel to said first board with said contact springs mounted on said boards.

16. A socket as set forth in claim 15 with said electrical connectors mounted on said boards.

17. A socket as set forth in claim 13, wherein said moving means comprises a cam actuator for moving said supporting plate a controlled distance.

18. A socket as set forth in claim 13, wherein said moving means is a lever arm pivotally mounted adjacent said supporting plate for moving said supporting plate a controlled distance.

19. A socket as set forth in claim 12, wherein said moving means comprises a base for supporting said supporting plate wherein said base and said supporting plate include holding means for said supporting plate after said supporting plate has been moved a controlled distance.

20. A socket as set forth in claim 14, wherein said contact springs are attached to project from said boards below said insertion openings.

21. A socket as set forth in claim 15, wherein said contact springs are demountably attached to one of said boards.

* * * * *